US010170575B2

(12) United States Patent
Cheng et al.

(10) Patent No.: US 10,170,575 B2
(45) Date of Patent: Jan. 1, 2019

(54) VERTICAL TRANSISTORS WITH BURIED METAL SILICIDE BOTTOM CONTACT

(71) Applicant: INTERNATIONAL BUSINESS MACHINES CORPORATION, Armonk, NY (US)

(72) Inventors: Kangguo Cheng, Schenectady, NY (US); Tak H. Ning, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

(21) Appl. No.: 15/157,012

(22) Filed: May 17, 2016

(65) Prior Publication Data

US 2017/0338334 A1 Nov. 23, 2017

(51) Int. Cl.

| H01L 29/45 | (2006.01) |
|---|---|
| H01L 29/786 | (2006.01) |
| H01L 29/66 | (2006.01) |
| H01L 29/78 | (2006.01) |
| H01L 21/265 | (2006.01) |
| H01L 21/78 | (2006.01) |

(52) U.S. Cl.
CPC ...... *H01L 29/456* (2013.01); *H01L 21/26506* (2013.01); *H01L 21/7806* (2013.01); *H01L 29/6656* (2013.01); *H01L 29/66666* (2013.01); *H01L 29/66742* (2013.01); *H01L 29/7827* (2013.01); *H01L 29/78642* (2013.01)

(58) Field of Classification Search
CPC ............... H01L 29/785; H01L 29/7827; H01L 29/66666; H01L 29/456; H01L 21/26506; H01L 29/66787; H01L 29/6656; H01L 21/7806
See application file for complete search history.

(56) References Cited

U.S. PATENT DOCUMENTS

| 4,916,083 A | 4/1990 | Monkowski et al. |
|---|---|---|
| 7,569,910 B2 | 8/2009 | Chang et al. |
| 7,799,675 B2 | 9/2010 | Lee |
| 8,058,142 B2 | 11/2011 | Lee |
| 8,187,934 B2 | 5/2012 | Wells et al. |
| 8,871,588 B2 | 10/2014 | Wells et al. |
| 9,159,825 B2 | 10/2015 | Molin et al. |

(Continued)

*Primary Examiner* — Hoang-Quan Ho
(74) *Attorney, Agent, or Firm* — Tutunjian & Bitetto, P.C.; Daniel P. Morris (57) ABSTRACT

A method of fabricating the vertical field effect transistor includes forming a dielectric layer on a metal semiconductor alloy layer that is present on a substrate of a semiconductor material. The dielectric layer is bonded to a supporting substrate. The substrate of the semiconductor material is cleaved, wherein a remaining portion of the semiconductor material provides a semiconductor surface layer in direct contact with the metal semiconductor alloy layer. A vertical fin type field effect transistor (FinFET) is formed atop the stack of the semiconductor surface layer, the metal semiconductor alloy layer, the dielectric layer and the supporting substrate, wherein the semiconductor surface layer provides at least one of a source region or a drain region of the FinFET and the metal semiconductor alloy provides a contact to the source region or the drain region of the FinFET.

7 Claims, 6 Drawing Sheets (56) References Cited

U.S. PATENT DOCUMENTS

| | | | |
|---|---|---|---|
| 9,257,553 B2 | 2/2016 | Lee | |
| 9,564,493 B2 * | 2/2017 | Colinge | H01L 29/267 |
| 2011/0115011 A1 * | 5/2011 | Masuoka | H01L 21/823431 |
| | | | 257/314 |
| 2011/0254067 A1 * | 10/2011 | Abbott | H01L 21/28132 |
| | | | 257/296 |
| 2011/0303985 A1 * | 12/2011 | Masuoka | H01L 21/84 |
| | | | 257/369 |
| 2015/0357432 A1 * | 12/2015 | Lin | H01L 29/66439 |
| | | | 257/24 |
| 2016/0133633 A1 * | 5/2016 | Liaw | H01L 23/528 |
| | | | 257/329 |
| 2016/0365439 A1 * | 12/2016 | Lin | H01L 29/42392 |
| 2017/0338334 A1 * | 11/2017 | Cheng | H01L 29/785 |

* cited by examiner

VERTICAL TRANSISTORS WITH BURIED METAL SILICIDE BOTTOM CONTACT

BACKGROUND

Technical Field

The present disclosure relates to methods of forming vertical finFET devices, and more particularly to a method of forming electrodes to vertical finFET.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been formed with the source, channel, and drain formed in the substrate material itself, where the current flows horizontally (i.e., in the plane of the substrate), and FinFETs have been formed with the channel extending outward from the substrate, but where the current flows vertically, as compared to a MOSFET with a single planar gate. Depending on the doping of the source and drain, an n-FET or a p-FET may be formed.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method of fabricating a vertical fin field effect transistor (FinFET) that includes providing a material stack comprising a semiconductor surface layer on a metal semiconductor alloy, wherein the metal semiconductor alloy layer is present on a dielectric layer; and forming a vertical fin type field effect transistor (FinFET) atop the material stack, wherein the semiconductor surface layer provides at least one of a source region or a drain region of the FinFET and the metal semiconductor alloy layer provides a contact to said source region or said drain region of the FinFET.

In another embodiment, the method of fabricating the vertical fin field effect transistor (FinFET) includes forming a dielectric layer on a metal semiconductor alloy layer that is present on a substrate of a semiconductor material. The dielectric layer is bonded to a supporting substrate. The substrate of the semiconductor material is cleaved, wherein a remaining portion of the semiconductor material provides a semiconductor surface layer in direct contact with the metal semiconductor alloy layer. A vertical fin type field effect transistor (FinFET) is formed atop the stack of the semiconductor surface layer, the metal semiconductor alloy layer, the dielectric layer and the supporting substrate. The semiconductor surface layer provides at least one of a source region or a drain region of the FinFET and the metal semiconductor alloy provides a contact to said source region or said drain region of the FinFET.

In another aspect, a vertical semiconductor device is provided that includes a contact provided by a metal semiconductor alloy layer. In some embodiments, the semiconductor device may include a material stack including a surface semiconductor layer present on a metal semiconductor alloy layer. A first of a source region or a drain region may be present in the surface semiconductor layer, and the semiconductor device may include a vertically orientated channel having a first end contacting the surface semiconductor layer. A gate structure may be in direct contact with the vertically orientated channel, and a second of the source region or the drain region can be present at a second end of the vertically oriented channel that is opposite said first end of the vertically orientated channel. The semiconductor device may further include a via contact in electrical communication with the metal semiconductor alloy layer providing a contact to one of the source region or the drain region of the semiconductor device.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. The source and drain regions of the fin structure are the portions of the fin structure that are on opposing sides of the channel region of the fin structure.

In an embodiment, a finFET semiconductor device has the drain, fin channel, and source device components arranged perpendicular to the plane of the substrate surface, which is referred to as a vertical stack (also referred to as vertical FinFET). A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

Vertical Transistors are attractive candidates for 5 nm node and beyond due to their potential of better density scaling and allowing relaxed gate lengths to better control the electrostatics without any sacrifice to gate contacted pitch size. It has been determined that one problem with vertical transistors is the series resistance on the bottom electrode, which in typical devices is formed from doped semiconductor material.

In some embodiments, the methods and structures disclosed herein can provide a bottom electrode from a temperature resistant refractory metal silicide, in which the methods disclosed herein leave only a small portion semiconductor between the metal silicide bottom electrode and the source and/or drain region of the vertical FinFET, in which in some embodiments the remaining semiconductor material is needed for contact and extension formation.

Figure 1:
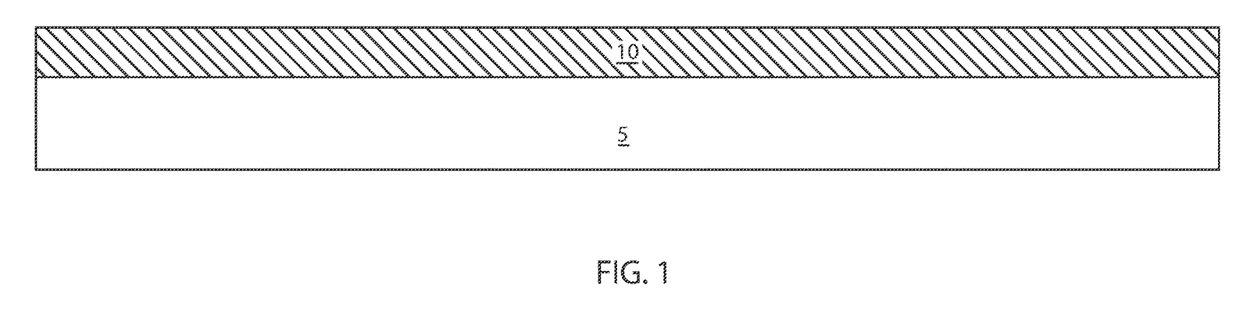
FIG. 1 is a side cross-sectional view of forming a metal semiconductor alloy layer on a semiconductor substrate, in accordance with one embodiment of the present disclosure.

FIG. 1 depicts one embodiment of forming a metal semiconductor alloy layer 10 on a semiconductor substrate 5. In various embodiments, the semiconductor substrate 5 may be crystalline. The semiconductor substrate 5 may be primarily (i.e., with doping) of a single element, for example, silicon (Si) or germanium, (Ge), or the substrate 10 may be a compound, for example, GaAs, SiC, or SiGe. In some embodiments, the semiconductor substrate 5 is composed of a type IV semiconductor material. In some embodiments, the semiconductor substrate 5 is composed of a type III-V semiconductor material. By "type IV semiconductor" it is meant that the semiconductor material includes at least one element from Group IVA (i.e., Group 14) of the Periodic Table of Elements. Examples of type IV semiconductor materials that are suitable for the semiconductor substrate 5 include silicon (Si), germanium (Ge), silicon germanium (SiGe), silicon doped with carbon (Si:C), silicon germanium doped with carbon (SiGe:C) and a combination thereof. A compound semiconductor may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the fin structures 10 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The substrate 5 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 5 may also have other layers forming the substrate, including high-k oxides and/or nitrides. In one or more embodiments, the substrate 5 may be a silicon wafer. In an embodiment, the substrate is a single crystal silicon wafer.

The metal semiconductor alloy layer 10 may be a silicide. For example, the metal semiconductor alloy layer 10 may be a silicide when the substrate 5 includes silicon (Si). A silicide is a metal semiconductor alloy in which the semiconductor component is provided by silicon. Examples of suitable silicides for the metal semiconductor alloy 10 may include nickel monosilicide, cobalt silicide ($CoSi_2$), a nickel silicide ($NiSi_2$), a palladium silicide ($PdSi_2$), a platinum silicide ($PtSi_2$), a tungsten silicide ($WSi_2$), molybdenum silicide ($MoSi_2$), zirconium silicide ($ZrSi_2$), ruthenium silicide ($RuSi_2$), rhenium silicide ($RhSi_2$), tantalum silicide ($TaSi_2$), copper silicide ($Cu_5Si$), vanadium silicide ($V_3Si$), iron silicide ($Fe_3Si$), manganese silicide ($Mn_3Si$), chromium silicide ($Cr_3Si$), uranium silicide ($U_3Si_2$), hafnium silicide (HfSi), tantalum silicide (TaSi), potassium silicide (KSi), rubidium silicide (RbSi), cesium silicide (CsSi), titanium silicide (TiSi), thallium silicide (ThSi), plutonium silicide (PuSi), calcium silicide (CaSi), strontium silicide (SrSi), yttrium silicide (YSi), and admixtures thereof.

Silicide formation typically requires depositing a refractory metal, such as Ni or Ti, onto the surface of a Si-containing material or wafer. Following deposition, the structure is then subjected to an annealing step using thermal processes such as, but not limited to, rapid thermal annealing. During thermal annealing, the deposited metal reacts with Si forming a metal silicide. The metal of the silicide may be deposited using a physical vapor deposition (PVD) method. Examples of PVD deposition suitable for the forming the metal of the silicide may include plating, electroplating, electroless plating, sputtering, sputtering via DC diode type systems, radio frequency (RF) sputtering, magnetron sputtering, and ionized metal plasma (IMP) sputtering. Following deposition, the structure is annealed to interdiffuse the metal from the deposited metal layer and the semiconductor of the substrate. Annealing may include any thermal process, such as furnace annealing, laser annealing, pulsed laser annealing, rapid thermal annealing (RTA) or combinations thereof. The temperature of the anneal process is typically less than 600° C., e.g., 500° C. or less. In some embodiments, an etch step may be employed to remove the unreacted metal that remains following formation of the metal alloy.

In other embodiments, the metal semiconductor alloy layer 10 may be deposited directed atop the substrate using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The metal semiconductor alloy layer 10 may have a thickness ranging from 5 nm to 100 nm. In another embodiment, the metal semiconductor alloy 10 may have a thickness ranging from 10 nm to 50 nm.

Figure 2:
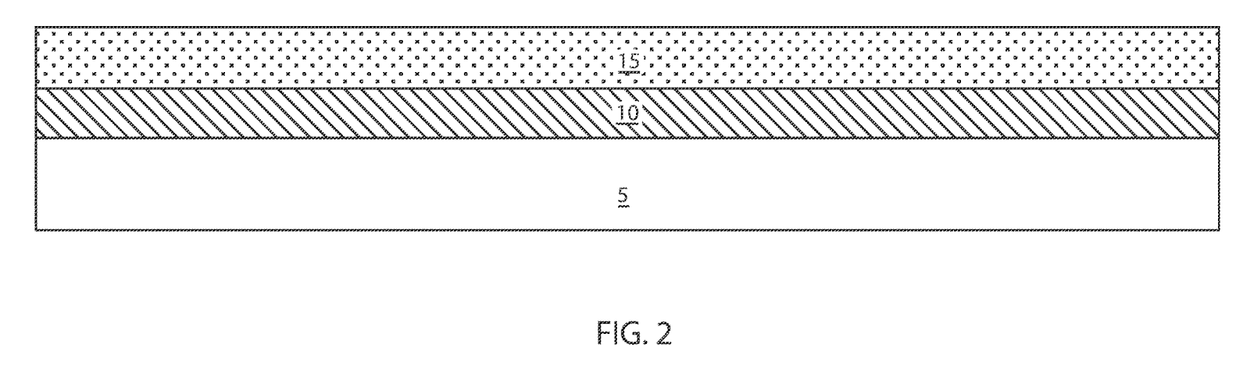
FIG. 2 is a side cross-sectional view of forming a dielectric layer on the metal semiconductor alloy layer that is depicted in FIG. 1, in accordance with one embodiment of the present disclosure.

FIG. 2 depicts one embodiment of forming a dielectric layer 15 on the metal semiconductor alloy layer 10 that is depicted in FIG. 1. In some embodiments, the dielectric layer 15 is an oxide containing dielectric. For example, the dielectric layer 15 may be composed of silicon dioxide ($SiO_2$). It is noted that silicon oxide ($SiO_2$) is only one example of a dielectric composition that is suitable for provided the dielectric layer 15. For example, the dielectric layer 15 may also be composed of aluminum oxide ($Al_2O_3$), hafnium oxide ($HfO_2$) or silicon oxynitride ($SiO_xN_y$). In other embodiments, the dielectric layer 15 is composed of a nitride containing dielectric. For example, the dielectric layer 15 may be composed of silicon nitride. It is noted that the above examples of compositions for the dielectric layer 15 have been provided for illustrative purposes only, and are not intended to limit the present disclosure. Other dielectric compositions are equally suitable for the dielectric layer 15 so long as the composition selected is suitable for bonding, as described in the layer transfer process depicted in FIGS. 3-5.

Figure 3:
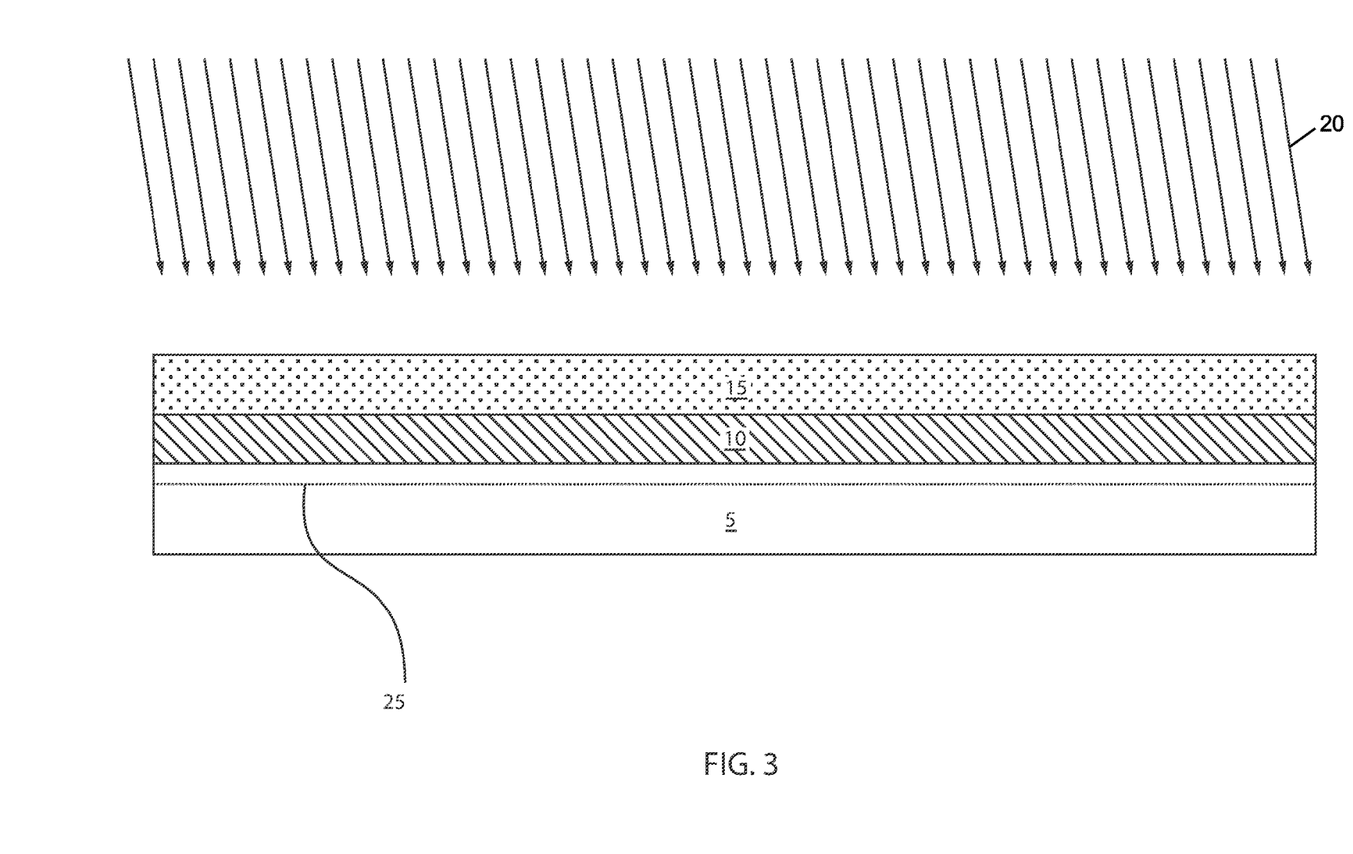
FIG. 3 is a side cross-sectional view depicting implanting a cleaving dopant into the semiconductor substrate, in accordance with one embodiment of the present disclosure.

FIG. 3 depicts implanting a cleaving dopant 20 into said semiconductor substrate 5. For example, the cleaving dopant 20 may be provided by a hydrogen ion implantation. In some embodiments, a hydrogen ($H_2$) implant may be conducted using an ion implantation apparatus by implanting hydrogen into through the dielectric layer 15 into the substrate at a dopant dosage ranging from $1 \times 10^{16}$ cm$^{-2}$ to $1 \times 10^{17}$ cm$^{-2}$. In some embodiment, the hydrogen implant dosage may range from $1 \times 10^{16}$ cm$^{-2}$ to $1 \times 10^{17}$ cm$^{-2}$. During ion implantation, the substrate temperature may be maintained within 200° C. to 400° C. In one example, during ion implantation, the substrate temperature may be maintained within 225° C. to 300° C.

In some embodiments, the implant energy for the ion implantation of the cleaving dopant 20 is selected so that the implant depth creates a cleave line 25 within the substrate 5 at a depth that allows for a sufficient amount of semiconductor material to remain engaged to the dielectric layer 15 that is suitable to support the formation of source and drain extension regions, as well as providing a suitable deposition surface for epitaxial growth. The cleave line 25 is the line across with the substrate is separated during the subsequent cleaving process step described with reference to FIG. 5.

Figure 4:
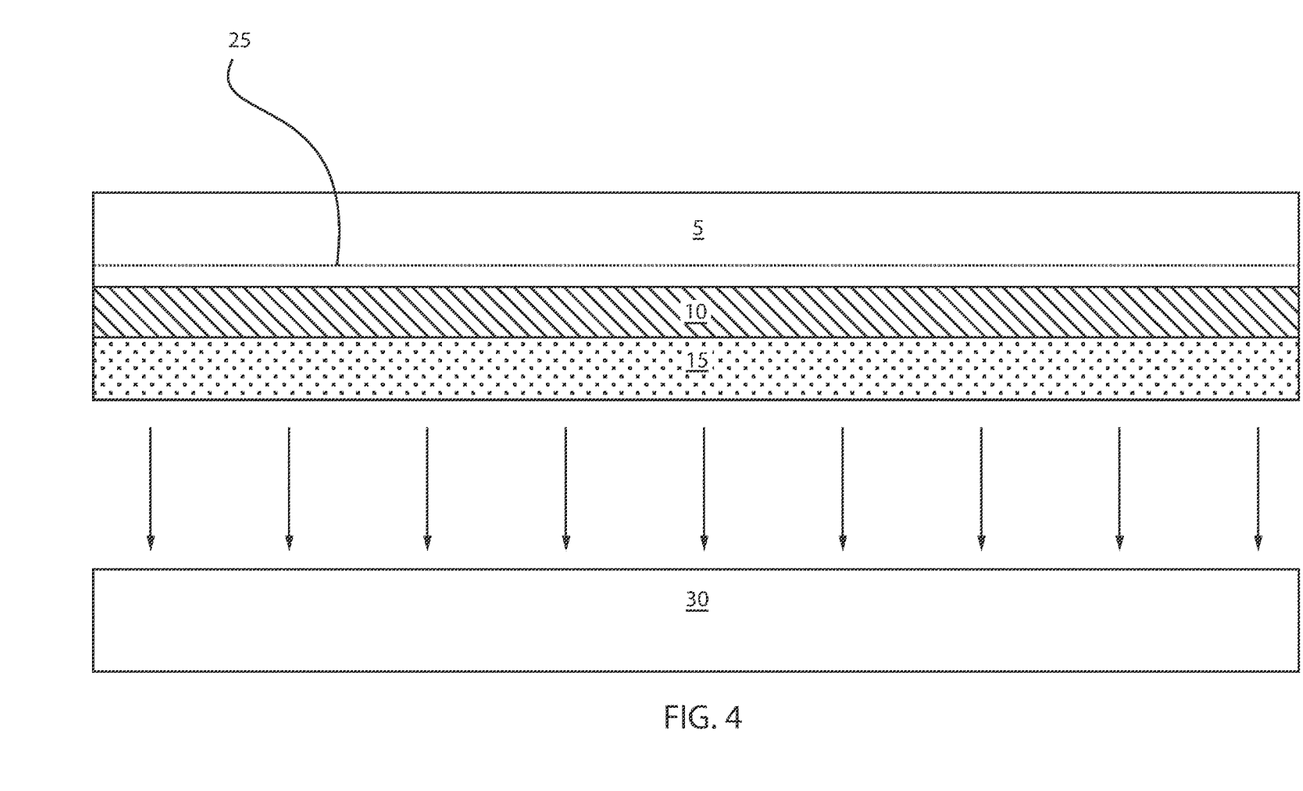
FIG. 4 is a side cross-sectional view depicting bonding the dielectric layer of the structure depicted in FIG. 3 to a supporting substrate, in accordance with one embodiment of the present disclosure.

FIG. 4 depicts bonding the dielectric layer 15 of the structure depicted in FIG. 3 to a supporting substrate 30. The supporting substrate 30 may be composed of a semiconductor material, such as a type IV semiconductor material or a type III-V semiconductor material. Examples of semiconductor materials suitable for the supporting substrate 30 have been provided above for the semiconductor substrate 5 that is described with reference to FIG. 1. The supporting substrate 30 may also be composed of a dielectric material, such as an oxide or nitride.

In some embodiments, prior to bonding, both the dielectric layer 15 and the supporting substrate 30 may be cleaned using an RCA clean. In one embodiment, the RCA clean includes a treatment of the dielectric layer 15 and the supporting substrate 5 in a solution of ammonium hydroxide and hydrogen peroxide followed by an aqueous mixture of hydrochloric acid and an oxidizing agent (e.g., $H_2O_2$, $O_3$). The first step of the RCA clean that includes ammonium hydroxide and hydrogen peroxide may be referred to as "SC-1" (standard clean #1). SC-1 includes of a mixture of ammonium hydroxide and hydrogen peroxide and deionized water. A typical concentration ratio for the mix is 1:1:5 $NH_4OH:H_2O_2:H_2O$, although ratios as low as 0.05:1:5 are suitable for cleaning the substrate 5. SC-1 typically operates in a temperature ranging from 50° C. to 70° C.

The second step of the RCA clean that includes the aqueous mixture of hydrochloric acid and an oxidizing agent may be may be referred to as "SC-2" (standard clean #2). SC-2 includes a mixture of hydrochloric acid, hydrogen peroxide, and deionized water. A typical concentration ratio for the mix is 1:1:5 $HCl:H_2O_2:H_2O$. SC-2 is typically operated in the temperature range of 50-70° C.

Following cleaning, hydrophilic bonding is performed at room temperature, e.g., 20° C. to 25° C., to bond the dielectric layer 15 to the supporting substrate 30. More specifically, the surfaces of the dielectric layer 15 and the supporting substrate 30 are made hydrophilic and are bonded together at room temperature, in which the supporting substrate 30 acts as a stiffener. In hydrophilic (or "direct") bonding, a hydroxyl group (OH—) is formed on a material surface due to the presence of an electric charge of atoms. Furthermore, several layers of water molecules are formed around hydroxyl groups on the surface. When such two ionic materials each having a sufficiently flat face are attached to each other, they are firmly bonded together through hydrophilic bonding by the hydrogen bond formed among the hydroxyl groups and water molecules. Thus, the flat faces of the ionic materials can be hydrophilic bonded with each other without using adhesives. A subsequent annealing makes the bonding stronger.

Figure 5:
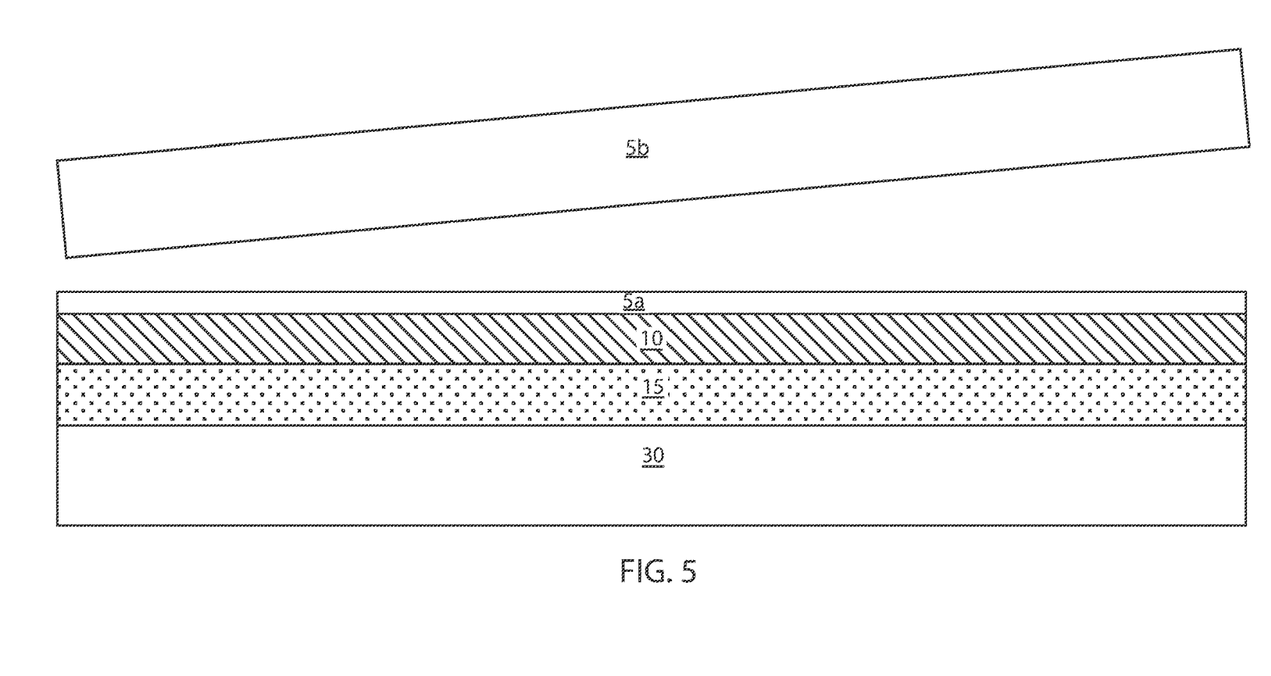
FIG. 5 is a side cross-sectional view depicting cleaving the semiconductor substrate along a cleave line in which the cleaving dopant is present, in accordance with one embodiment of the present disclosure.

For example, a two-phase heat treatment can applied to the two bonded structures, i.e., the dielectric layer 15 and the supporting substrate 30. In some examples, the structure including the bonded dielectric layer 15 and the supporting substrate 30 are annealed to about 400° to 600° C., which promotes the formation and linkage of regions of brittle silicon hydride. When the hydride regions are completely linked across the bonded structure, the semiconductor substrate 5 is fractured and separated along the hydride rich cleave line 25, as depicted in FIG. 5. The split, i.e., cleaving, takes place because of phenomena of blistering and flaking along the cleave line 25 induced by the hydrogen implantation.

Referring to FIG. 5, following cleaving, a thin remaining portion of the semiconductor substrate 5a remains engaged to the metal semiconductor alloy layer 10, and the separated portion of the semiconductor substrate 5b is removed from the structure, which can be recycled and used as a handle wafer. In some embodiments, in which the semiconductor substrate 5 is a monocrystalline material, e.g., a monocrystalline layer of silicon, the remaining portion 5a may also be a monocrystalline material, e.g., a monocrystalline layer of silicon. The remaining portion of the semiconductor material provides a semiconductor surface layer 5a in direct contact with the metal semiconductor alloy layer 10.

In some embodiments, in a following process step, the material stack including the semiconductor surface layer 5a, the metal semiconductor alloy layer 10, and the dielectric layer 15 bonded to the supporting substrate 30 are annealed at a high temperature (approximately 1000° C.) to promote a stronger bonding between the support substrate 30 and the dielectric layer 15. After splitting, the separated surface of the device usually has a roughness on the order of a few hundred angstroms. A chemical mechanical planarization (CMP) process may be conducted to reduce the roughness of the semiconductor surface layer 5a. Thus, despite good control of the thickness allowed by the implantation process, the final thickness uniformity and surface roughness of the semiconductor surface layer 5a can be adjusted using the CMP parameters.

In some embodiments, following planarization, the semiconductor surface layer 5a may have a thickness ranging from 5 nm to 100 nm. In another embodiment, semiconductor surface layer 5a may have a thickness ranging from 10 nm to 50 nm.

Figure 6:
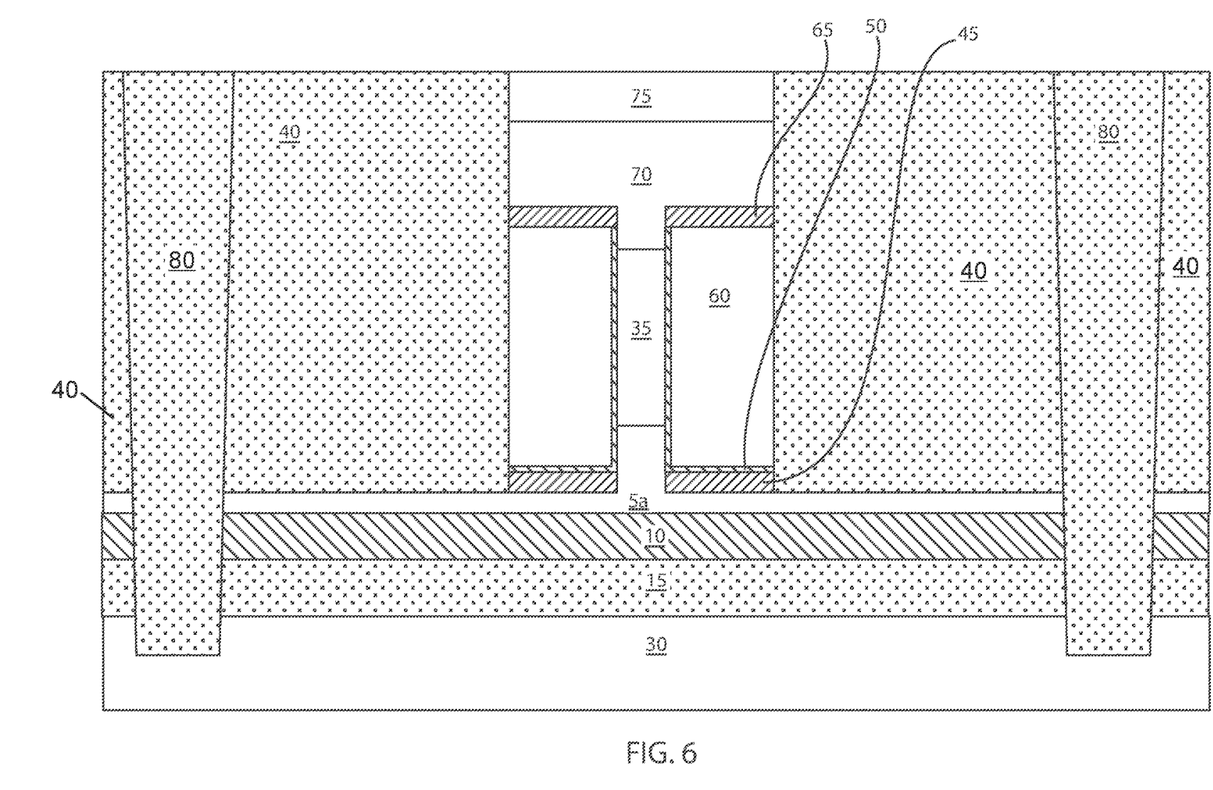
FIG. 6 is a side cross-sectional view depicting forming a vertical fin type field effect transistor (FinFET) atop the material stack depicted in FIG. 5, wherein the upper semiconductor surface layer of the material stack provides at least one of a source region and a drain region of the FinFET and the metal semiconductor alloy provides a contact to one of the source region or said drain region of the FinFET.

FIG. 6 depicts forming a vertical fin type field effect transistor (FinFET) 100 atop the material stack depicted in FIG. 5, wherein the upper semiconductor surface layer 5a provides at least one of a source region or a drain region of the FinFET and the metal semiconductor alloy 10 provides a contact to said source region or said drain region of the FinFET 100. Forming the vertical fin field effect transistor (FinFET) 100 may begin with forming for at least one of a source region and a drain region. In the embodiments described with respect to the supplied figures, a drain region is formed at this stage of the process, but alternative process flows have been considered in which the source region is formed at this stage of the process.

Forming the drain region may include doping the semiconductor surface layer 5a with an n-type or p-type dopant. The conductivity type of the drain region, e.g., n-type or p-type conductivity type, typically dictates the conductivity type of the semiconductor device, e.g., whether the vertical FinFET is an p-type FinFET or an n-type FinFET. For example, a FinFET semiconductor device having n-type source and drain regions will be an n-type FinFET, while a FinFET semiconductor device having p-type source and drain regions is typically a p-type FinFET. As used herein, "p-type" refers to the addition of impurities to an intrinsic semiconductor that creates deficiencies of valence electrons. In a type IV semiconductor material, such as silicon and germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as silicon or germanium, examples of n-type dopants, i.e., impurities, include but are not limited to antimony, arsenic and phosphorous.

In some embodiments, the n-type or p-type dopant for providing the drain region may be introduced to the semiconductor surface layer 5a by ion implantation or in-situ doping, which may occur before or after the above described cleaving step that is depicted in FIG. 5. In some embodiments, the drain region may be provided by an epitaxially formed semiconductor material that is formed atop the semiconductor surface layer.

In a following process step, the material layer for providing a first low-k dielectric spacer 45 is deposited atop the semiconductor surface layer 5a. The material layer for the first low-k dielectric spacer 45 may be deposited atop the semiconductor surface layer 5a, which may then be patterned and etched to form openings through the first low-k spacer material to provide fin structure openings to the semiconductor material of the drain regions, e.g., the semiconductor surface layer 5a. The width of the fin structure openings typically dictates the width of the epitaxial semiconductor channel material for the device.

As used herein, the term "low-k" denotes a dielectric material having a dielectric constant equal to the dielectric constant of silicon oxide ($SiO_2$) or less. The first low-k dielectric spacers 45 typically have a dielectric constant that is less than 7.0, e.g., 5.5. In one embodiment, the first low-k dielectric material has a dielectric constant ranging from 3.9 to 6. In another embodiment, the first low-k dielectric material has a dielectric constant less than 3.9. Examples of materials suitable for the first low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The first low-k spacer material may be deposited using at least one of spin on deposition, chemical vapor deposition (CVD), plasma-assisted CVD, evaporation and chemical solution deposition.

Following the deposition of the first low-k spacer material, the layer of low-k spacer material may be patterned and etched to form fin structure openings. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. The term "selective" as used to describe a material removal process denotes that the rate of material removal for a first material is greater than the rate of removal for at least another material of the structure to which the material removal process is being applied. Following formation of the patterned photoresist (also referred to as a photoresist etch mask), the exposed portions of the low-k spacer material may be etched. The etch process may be anisotropic, and typically is selective to the semiconductor material of the semiconductor surface layer 5a. For example, the etch process for forming the fin structure openings is a reactive ion etch process. As noted above, in some embodiments, the width of the fin structure openings dictates the width of the later formed epitaxially formed semiconductor channel material for the device.

Still referring to FIG. 6, in a following process step, a semiconductor material layer may be deposited for forming the vertical channel region 35 of the vertically orientated FinFET. The semiconductor material layer for the channel region may be formed beginning with an epitaxial growth method. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

In some embodiments, before forming the vertical channel region 35 in the fin structure openings through the material layer for the first low-k dielectric spacer 45, epitaxial semiconductor material may be first deposited for providing a portion of the drain region (or source region) atop the semiconductor surface layer 5a. The epitaxial semiconductor material that provides a portion of the drain region within the fin structure opening may be doped with an n-type or p-type dopant, which can be introduced in situ or by using ion implantation.

In some embodiments, the epitaxial semiconductor material that provides the channel region 35 may be composed of silicon. Examples of silicon gas source for epitaxial deposition of the vertical channel region 35 may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, the epitaxial semiconductor material that provides the channel region 35 may be composed of germanium (Ge). Examples of germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the channel region 35 may be composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The epitaxially formed semiconductor material of the vertical channel region 35 typically fills the openings defined by the space between the opposing sidewalls of the fin openings through the material layer for the first low-k dielectric spacer 45. In some embodiments, the epitaxially formed vertical channel region 35 may have a height ranging from 5 nm to 200 nm. In another embodiment, the epitaxially formed vertical channel region 35 has a height ranging from 10 nm to 100 nm. In one embodiment, the epitaxially formed vertical channel region 35 has a width of less than 20 nm. In another embodiment, the epitaxially formed vertical channel region 35 has a width ranging from 3 nm to 8 nm. In some embodiments, because the semiconductor surface layer 5a is composed of a monocrystalline material, the epitaxially formed channel region 35 may also be composed of a monocrystalline material.

After forming the vertical channel region 35, the method may continue with recessing the material layer for the first low-k dielectric spacer 45. In some embodiments, the etch process for recessing the first low-k spacer material 45 is an anisotropic etch process, such as reactive ion etch, plasma etching, or laser etching. In other embodiments, the etch process for recessing the first low-k spacer material 45 is an isotropic etch, such as a wet chemical etch. The remaining portion of the material layer for the first low-k spacer material 45 following the aforementioned etch step provides the first low-k spacer 45 that is depicted in FIG. 6. The first low-k spacer 45 may have height ranging from 3 nm to 20 nm.

Still referring to FIG. 6, a gate dielectric 50 and gate conductor 60 may then be formed atop the first low-k spacer 45 and in direct contact with the channel region 35. The gate dielectric 50 is first formed on the channel region 35. Typically, the gate dielectric 50 is formed using a conformal deposition process. The gate dielectric 50 may be composed of any dielectric material, such as an oxide, nitride or oxynitride material. In some embodiments, the gate dielectric 50 is a high-k dielectric material. As used herein, "high-k" denotes a dielectric material featuring a dielectric constant (k) higher than the dielectric constant of $SiO_2$ at room temperature. For example, the least one gate dielectric layer 50 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 50 include hafnium silicate, hafnium silicon oxynitride or combinations thereof. The gate dielectric 50 may be deposited using atomic layer deposition (ALD). In other embodiments, the gate dielectric 50 may be deposited using chemical vapor deposition methods, such as plasma enhanced chemical vapor deposition (PECVD). In one embodiment, the at least one gate dielectric layer 50 has a thickness ranging from about 1.0 nm to about 6.0 nm.

Following formation of the gate dielectric 50, a work function metal layer of the gate conductor 60 may be deposited. The work function metal may be selected to provide a p-type work function metal layer and an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift"

as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof. A gate electrode portion of the gate conductor 60 may then be formed on the work function metal layer of the gate conductor 60. In various embodiments, the gate electrode is a metal, where the metal may be tungsten (W), tungsten nitride (WN) or combinations thereof. In one or more embodiments, the gate electrode 60 is tungsten (W). The gate electrode may be deposited by CVD, e.g., plasma enhanced chemical vapor deposition (PECVD).

A second low-k spacer 65 may then be formed on the gate structure 50, 60. In various embodiments, the second low-k spacer 65 may be composed of a same material as the first low-k spacer 45. Therefore, the above description of the dielectric material for the first low-k spacer 45 is suitable for the description of the composition of the second low-k spacer 65. For example, the second low-k spacer 65 may be an oxide. The second low-k spacer 65 may be deposited using a chemical vapor deposition process, such as plasma enhanced chemical vapor deposition (PECVD). In other examples, the second low-k spacer 65 may be deposited using chemical solution deposition or spin on deposition. In some embodiments, the height of the material layer for the second low-k spacer 65 may be reduced to expose a portion of the distal end of the region 35 to provide an epitaxial growth surface for a subsequently formed source region (or drain region in embodiments in which the source region has already been formed). The height of the material layer for the second low-k spacer 65 may be reduced by etching, such as reactive ion etching (RIE), which may be aided by the presence of an etch mask, such as a photoresist mask.

Still referring to FIG. 6, a source region 70 may be formed on the exposed surface of the vertical channel region 35 of the device. In various embodiments, the source region 70 may be epitaxially grown on the top surface of the epitaxially formed semiconductor vertical channel region 35, where the source region 70 may have the same crystal structure and orientation as the underlying epitaxially formed semiconductor vertical channel region 35. In some embodiments, the source region 70 may be composed of Si, SiGe, Si:C, or Si:P. The epitaxial deposition process for forming the source region 70 is similar to the epitaxial deposition process for forming the vertical channel region 35. Therefore, the above description of the epitaxial deposition process for forming the vertical channel region 35 is suitable for the epitaxial deposition process for forming the source region 70. The source region 70 is typically doped to an n-type or p-type conductivity, and typically have the same conductivity type as the drain region that is described above. The source region 70 is doped with an n-type or p-type dopant, which is typically the same conductivity type as the drain region. The dopant that dictates the conductivity type of the source region 70 may be introduced using ion implantation or in situ doping. It is noted that in the embodiments, in which the source region is formed before the vertical channel region 35, the structure identified by reference number 70 may provide the drain region.

Referring to FIG. 6, following formation of the source region 70, a top contact 75 is formed in electrical communication with the source region 70. The top contact 75 is typically composed of an electrically conductive material, such as a metal or a doped semiconductor. For example, the top contact 75 may be composed of copper, aluminum, tungsten, platinum or an alloy thereof. The top contact 75 may be formed using a physical vapor deposition (PVD). process, such as plating, electroplating, electroless plating, sputtering and combinations thereof.

In a following process step, the material stack including the first low-k spacer 45, gate dielectric 50, gate conductor 60, second low-k spacer 65, drain region 70 and top contact 75 may be patterned and etched to define the transistor portion of the device. For example, a photoresist mask may be formed protecting the transistor portion of the device, in which the remaining exposed portion may be removed by an anisotropic etch process, such as reactive ion etch (RIE), that is selective to the semiconductor surface layer 5a.

In a following process step, an interlevel dielectric layer 40 may be deposited and planarized so that the upper surface of the interlevel dielectric layer 40 is coplanar with the upper surface of the top contact 75. The interlevel dielectric layer 40 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™ other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 40 include any of the aforementioned materials in porous form, or in a form that changes during processing to or from being porous and/or permeable to being non-porous and/or non-permeable. The interlevel dielectric layer 40 may be deposited using chemical vapor deposition, deposition from solution, spin on deposition and combinations thereof. The planarization process applied to the interlevel dielectric 40 following its deposition may be chemical mechanical planarization.

Still referring to FIG. 6, trench isolation regions 80 may be formed on opposing sides of the transistor.

The trench isolation regions 80 may be formed by etching a trench through the interlevel dielectric 40, the semiconductor surface layer 5a, the metal semiconductor alloy layer 10 and the dielectric layer 15 into the supporting substrate 30 utilizing a dry etching process, such as reactive ion etching (RIE) or plasma etching. The trenches may then be filled with a dielectric material, such as silicon oxide, using chemical vapor deposition (CVD) or another like deposition process. A planarization process, such as chemical-mechanical polishing (CMP) may optionally be used to provide a planar structure.

Figure 7:
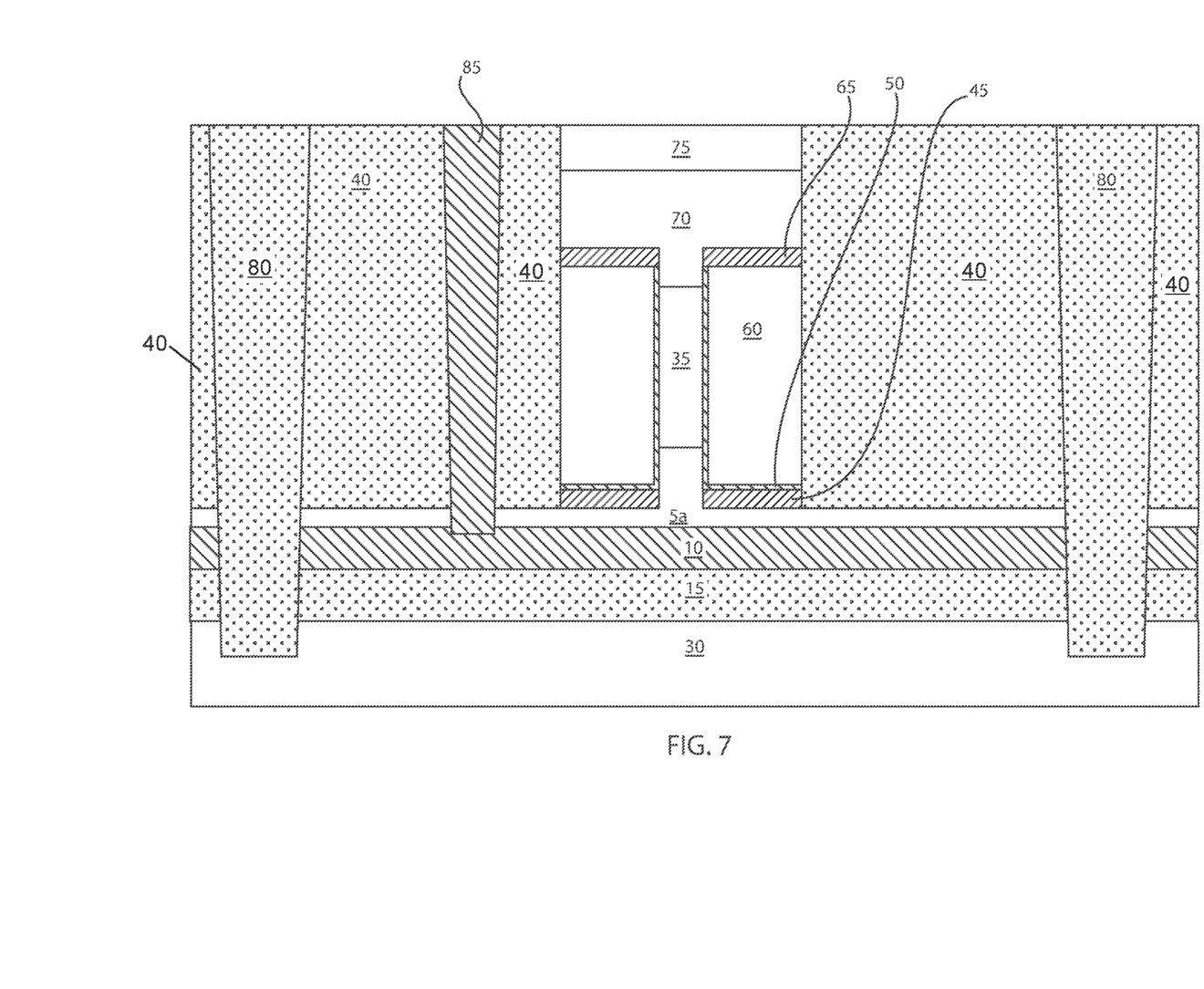
FIG. 7 is a side cross-sectional view depicting one embodiment of forming a via contact to the metal semiconductor alloy layer depicted in FIG. 6.

FIG. 7 depicts one embodiment of forming a via contact 85 to the metal semiconductor alloy layer 10 depicted in FIG. 6. The via contact 85 may be produce by forming a via opening through the interlevel dielectric 40, and the semiconductor surface layer 5a extending into the metal semiconductor alloy layer 10; and filling the via opening with an electrically conductive material. The via opening may be formed using photolithography and etch processes. For example, a photoresist mask may be formed exposing the portion of the interlevel dielectric in which the via opening it to be formed, wherein following formation of the photoresist mask, the via opening may be etched into the interlevel dielectric using an etch process, such as reactive ion etch, which can be selective to the metal semiconductor alloy layer 10. The via opening may be filled with a doped semiconductor material, such as n-type doped polysilicon, or a metal, such as copper, aluminum, titanium, tungsten, platinum or combinations thereof. The electrically conductive material may be deposited into the via opening using chemical vapor deposition (CVD), e.g., when the via contact 85 is composed of n-type polysilicon, or physical vapor deposition (PVD), e.g., when the via contact 85 is composed of a metal. Examples of PVD processes suitable for depositing the metal for the via contact 85 include plating, electroplating, electroless plating, sputtering and combinations thereof.

In some embodiments, the method described with reference to FIGS. 1-7 can provide a semiconductor device 100, e.g., vertical fin field effect transistor (vertical FinFET), that includes a material stack including a surface semiconductor layer 5a that is present on a metal semiconductor alloy layer 10. The semiconductor device 100 may a first of a source region or a drain region (e.g., source region) present in the surface semiconductor layer 5a. The semiconductor device may include a vertically orientated channel region 35 having a first end contacting the surface semiconductor layer 5a, and a second end in contact with the second of a source and drain region (e.g., drain region). A gate structure 50, 60 may be in direct contact with the vertically orientated channel region 35. In some embodiments, the semiconductor device includes a via contact 85 in electrical communication with the metal semiconductor alloy layer providing a contact to the first of said source region or said drain region (e.g., source region) of the semiconductor device that is present in the surface semiconductor layer 5a. The via contact 85 may be in electrical communication to the source region of the device through the metal semiconductor alloy layer 10, which may be a silicide selected from the group consisting of tungsten silicon, molybdenum silicide, tantalum silicide and combinations thereof. The semiconductor surface layer 5a that is in direct contact with the metal semiconductor alloy layer 10 may have a thickness ranging from 5 nm to 100 nm.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
 a material stack including a surface semiconductor layer present on a metal semiconductor alloy layer;
 a first of a source region or a drain region present in the surface semiconductor layer, the surface semiconductor layer including the first of the source or the drain region having a first portion that extends continuously across an entirety of a width of the semiconductor device, and a second portion that has a pedestal geometry that does not extend the entirety of the width of the semiconductor device;
 a vertically orientated channel having a first end contacting and aligned with the second portion of the surface semiconductor layer that has the pedestal geometry;
 a gate structure in direct contact with the vertically orientated channel;
 a second of the source region or the drain region present at a second end of the vertically oriented channel that is opposite said first end of the vertically orientated channel; and
 a via contact in electrical communication with the metal semiconductor alloy layer providing a contact to said first of said source region or said drain region of the semiconductor device, wherein the metal semiconductor alloy layer extends continuously across the entirety of the width of the semiconductor device including being present directly underlying a portion of the surface semiconductor layer that is present directly underlying an entirety of the vertically, orientated channel.

2. The semiconductor device of claim 1, wherein the semiconductor device is a vertically orientated n-type or p-type FinFET.

3. The semiconductor device of claim 1, wherein the metal semiconductor alloy is a silicide selected from the group consisting of tungsten silicon, molybdenum silicide, tantalum silicide and combinations thereof.

4. The semiconductor device of claim 1 further comprising an interlevel dielectric of a silicon containing dielectric and said via contact extending through the interlevel dielectric into electrical communication with the metal semiconductor alloy.

5. The semiconductor device 1, wherein an active region of the semiconductor device has a width defined by isolation regions positioned on opposing sides of the semiconductor device.

6. The semiconductor device 1, wherein the material stack further comprises;
 a dielectric layer, wherein the metal semiconductor alloy layer is present on the dielectric layer; and
 a supporting substrate, wherein the dielectric layer is present on the supporting substrate.

7. The semiconductor device of claim 1, wherein the semiconductor surface layer comprises a thickness ranging from 5 nm to 100 nm.

* * * * *